US012751216B2

(12) United States Patent
Kammler et al.

(10) Patent No.: US 12,751,216 B2
(45) Date of Patent: Sep. 29, 2026

(54) GATE ARRANGEMENT FOR QUANTUM DOT STRUCTURES

(71) Applicant: GlobalFoundries U.S. Inc., Malta, NY (US)

(72) Inventors: Thorsten E. Kammler, Dresden (DE); Peter Baars, Dresden (DE); Manfred Michael Zier, Dresden (DE)

(73) Assignee: GLOBALFOUNDRIES U.S. Inc., Malta, NY (US)

(*) Notice: Subject to any disclaimer, the term of this patent is extended or adjusted under 35 U.S.C. 154(b) by 448 days.

(21) Appl. No.: 18/374,220

(22) Filed: Sep. 28, 2023

(65) Prior Publication Data

US 2025/0113744 A1 Apr. 3, 2025

(51) Int. Cl.
*H10N 60/10* (2023.01)
*H10N 60/01* (2023.01)

(52) U.S. Cl.
CPC ........... *H10N 60/128* (2023.02); *H10N 60/01* (2023.02); *H10N 60/11* (2023.02)

(58) Field of Classification Search
CPC ...................................................... H10N 60/12
USPC ........................................................... 257/39
See application file for complete search history.

(56) References Cited

U.S. PATENT DOCUMENTS

| | | | |
|---|---|---|---|
| 11,329,145 B2 | 5/2022 | Hutin et al. | |
| 2019/0392352 A1 | 12/2019 | Lampert et al. | |
| 2020/0312990 A1* | 10/2020 | Roberts | H10D 62/814 |
| 2021/0296556 A1 | 9/2021 | Hsu et al. | |
| 2022/0083890 A1 | 3/2022 | Simion et al. | |
| 2022/0190135 A1* | 6/2022 | Kotlyar | H10D 30/6735 |
| 2022/0231132 A1 | 7/2022 | Niebojewski | |
| 2022/0292384 A1 | 9/2022 | Bertrand et al. | |
| 2022/0336648 A1 | 10/2022 | Fogarty et al. | |
| 2024/0130249 A1 | 4/2024 | Hsu et al. | |
| 2024/0204089 A1 | 6/2024 | Samkharadze et al. | |

FOREIGN PATENT DOCUMENTS

| | | |
|---|---|---|
| EP | 3967650 | 3/2022 |
| EP | 4012781 | 6/2022 |
| EP | 4071825 | 10/2022 |
| FR | 3119044 | 7/2022 |
| WO | 2020229808 | 11/2020 |
| WO | 2021194995 | 9/2021 |
| WO | 2022216156 | 10/2022 |

OTHER PUBLICATIONS

Geyer, Simon, et al. "Silicon quantum dot devices with a self-aligned second gate layer." arXiv preprint arXiv:2007.15400. Jul. 30, 2020; 9 pages; https://doi.org/10.48550/arXiv.2007.15400.

Extended European Search Report for European Application No. 24163163.9-1211, mailed Sep. 16, 2024, 12 pages.

* cited by examiner

*Primary Examiner* — Ajay Arora
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to quantum dot structures and methods of manufacture. The structure includes: a plurality of barrier gates; a plurality of spin qubit gates interdigitated with the plurality of barrier gates; and access gates on opposing sides of the plurality of barrier gates.

20 Claims, 5 Drawing Sheets

GATE ARRANGEMENT FOR QUANTUM DOT STRUCTURES

BACKGROUND

The present disclosure relates to semiconductor structures and, more particularly, to quantum dot structures and methods of manufacture.

Spin qubit quantum computer is a quantum computer based on controlling the spin of charge carriers (electrons and electron holes) in semiconductor devices. The spin qubit quantum computer uses the intrinsic spin of freedom of individual electrons confined in quantum dots as quantum bits also known as qubits. Quantum dots are tiny semiconductor structures that can serve as qubits, with quantum information stored in the spin or charge states of confined electrons. Accordingly, the quantum bit, or qubit, is the fundamental unit of information for a quantum computer.

Spin qubits have been implemented by locally depleting two-dimensional electron gases in semiconductor materials such a gallium arsenide, silicon and germanium. Spin qubits have also been implemented in graphene. But the limited coherence time of these qubits greatly restricts their potential applications.

SUMMARY

In an aspect of the disclosure, a structure comprises: a plurality of barrier gates; a plurality of spin qubit gates interdigitated with the plurality of barrier gates; and access gates on opposing sides of the plurality of barrier gates.

In an aspect of the disclosure, a structure comprises: spin qubit gates; self-aligned barrier gates interdigitated with the plurality of spin qubit gates; access gates on opposing sides of the barrier gates; source and drain regions adjacent to the access gates; and a liner material separating the spin qubit gates, the self-aligned barrier gates and the access gates from one another, and the access gates from the source and drain regions.

In an aspect of the disclosure, a method comprises: forming a plurality of barrier gates; forming a plurality of spin qubit gates interdigitated with the plurality of barrier gates; and forming access gates on opposing sides of the plurality of barrier gates.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to quantum dot structures and methods of manufacture. More specifically, the structures described herein comprise self-aligned barrier gates comprising polysilicon or metal fill between spin qubit gates. In this way, the polysilicon or metal fill comprise self-aligned barrier gates interdigitated with the spin qubit gates. Advantageously the self-alignment of the barrier gates is a low-complexity process and provides improved alignment while reducing variation of the spin qubit gates. Also, the process flows are compatible with current CMOS flows.

In more specific embodiments, the structures provided herein can be implemented in a quantum dot device (e.g., spin qubit quantum computer). The structure includes a plurality of barrier gates with spin qubit gates interdigitated with the plurality of barrier gates. The barrier gates may be symmetrically positioned between the access gate and spin qubit gate. The barrier gates may also be separated or electrically isolated from a gate dielectric material of the spin qubit gates by a conformal liner (e.g., barrier liner). The spin qubit gates may be, for example, polysilicon or high-k metal gate structures. The barrier gates, on the other hand, may be a conducting material. Access gates may be provide on opposing sides of the string of gates, e.g., the barrier gates at the end of the string of gates. In embodiments, the access gates may have a larger dimension than the spin qubit gates or the barrier gates. Raised source and drain regions may be provided adjacent to the access gates. A semiconductor on insulator transistor may be provided adjacent to the quantum dot device.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
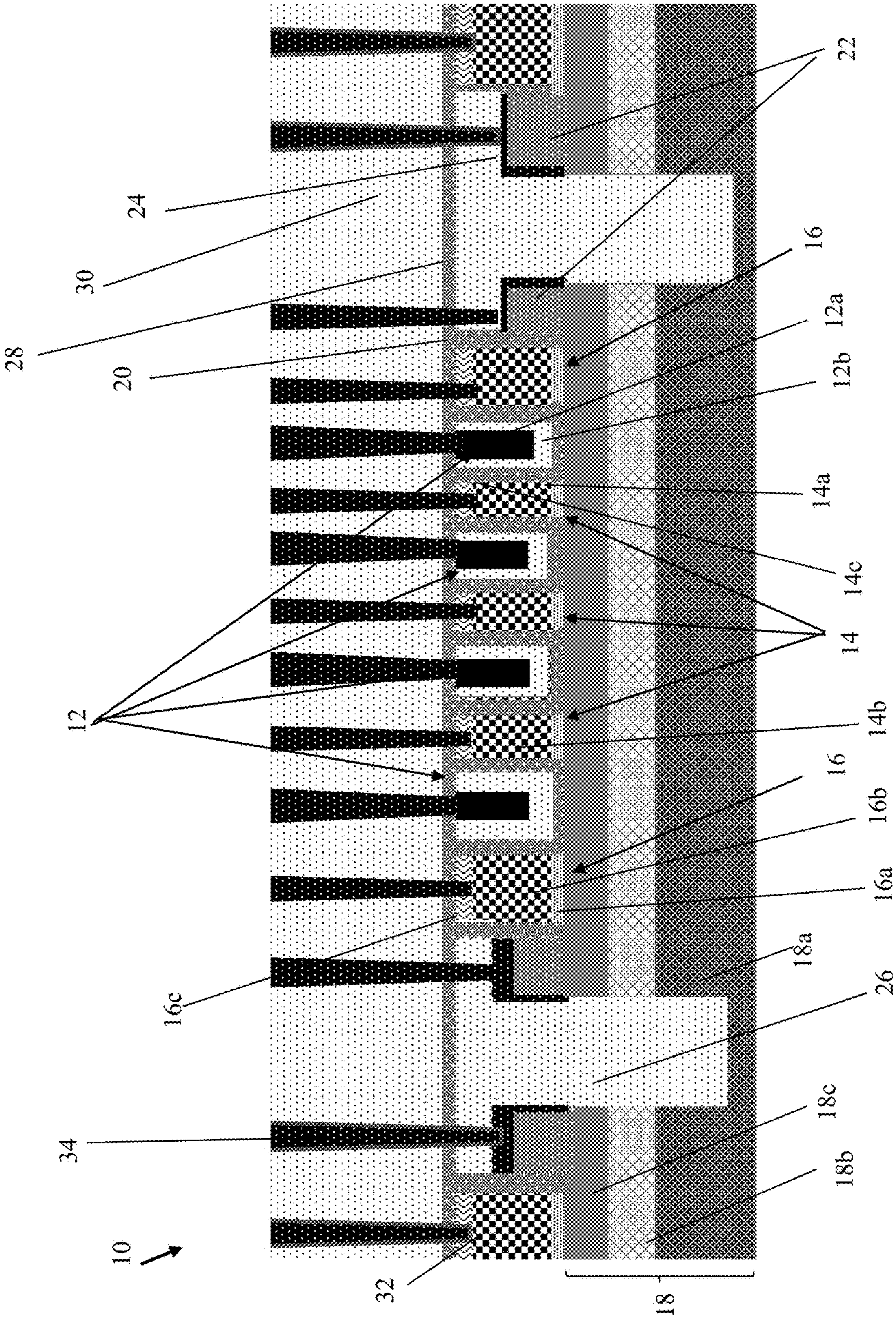
FIG. 1 shows a structure and respective fabrication processes in accordance with aspects of the present disclosure.

FIG. 1 shows a structure and respective fabrication processes in accordance with aspects of the present disclosure. In particular, the structure 10 shown in FIG. 1 includes a plurality of barrier gates 12 alternating with a plurality of spin qubit gates 14. In embodiments, the plurality of barrier gates 12 may be interdigitated with the plurality of spin qubit gates 14. The plurality of barrier gates 12 may also be symmetrically positioned with respect to the plurality of spin qubit gates 14 and access gates 16. The plurality of barrier gates 12 may be self-aligned barrier gates 12 comprising metal fill material as further described herein. The access gates 16 may be provided adjacent to the plurality of barrier gates 12, at opposing ends of the plurality of barrier gates 12 alternating with the plurality of spin qubit gates 14. In embodiments, the plurality of barrier gates 12 may be electrically and physically isolated from the spin qubit gates 14, with each of the gates 12, 14, 16 capable of being independently biased.

Still referring to FIG. 1, in embodiments, the structure 10 further includes a semiconductor substrate 18. The semiconductor substrate 18 may be, for example, a semiconductor on insulator substrate comprising a handle substrate **18*a*, insulator layer 18*b* on top of the handle substrate 18*a* and a semiconductor layer 18***c* on top of the insulator layer 18*b*. The handle substrate 18*a* provides mechanical support to the buried insulator layer 18*b* and the top semiconductor layer 18*c*. The gates 12, 14, 16 are formed on the top semiconductor layer 18*c*.

The handle substrate 18*a* and the semiconductor substrate 18*c* may be composed of any suitable material including, but not limited to, Si, SiGe, SiGeC, SiC, alloys, GaAs, InAs, InP, and other III/V or II/VI compound semiconductors. In embodiments, the semiconductor substrate 18*c* may comprise any suitable single crystallographic orientation (e.g., a (100), (110), (111), or (001) crystallographic orientation). The top semiconductor layer 18*c* can be formed by a deposition process, such as CVD or PECVD. Alternatively, the top semiconductor layer 18*c* may be formed using a smart cut process where two semiconductor wafers are bonded together with an insulator in between.

The insulator layer 18*b* comprises any suitable material, including silicon oxide, sapphire, other suitable insulating materials, and/or combinations thereof. An exemplary insulator layer may be a buried oxide layer (BOX). The insulator layer 18*b* may be formed by any suitable process, such as separation by implantation of oxygen (SIMOX), oxidation, deposition, e.g., chemical vapor deposition (CVD), plasma enhanced chemical vapor deposition CVD (PECVD) or physical vapor deposition (PVD), and/or other suitable process.

Still referring to FIG. 1, shallow trench isolation structures 26 may be formed adjacent to access gates 16 and, more specifically, adjacent to raised source and drain regions 22. In embodiments, the shallow trench isolation structures 26 can be formed by conventional lithography, etching and deposition methods known to those of skill in the art as further described with respect to FIG. 3A.

The plurality of barrier gates 12 alternating (e.g., interdigitated) with the plurality of spin qubit gates 14 are formed on the semiconductor substrate 18. The access gates 16 may be provided at both ends of the string of the alternating barrier gates 12 and spin qubit gates 14, also on the semiconductor substrate 18. In embodiments, the plurality of barrier gates 12 may be self-aligned barrier gates 12 comprising a metal fill material 12*a*, surrounded by a dielectric material 12*b*. The metal fill material 12*a* may be any conductive material including, e.g., tungsten, and the dielectric material 12*b* may be an oxide material as an example. The oxide material 12*b* may electrically and physically isolate the barrier gates 12, e.g., metal fill material 12, from the spin qubit gates 14. The access gates 16 may be of a different size, e.g., larger, than either the barrier gates 12 or spin qubit gates 14.

An optional barrier layer 20 may line the barrier gates 12, the spin qubit gates 14 and the access gates 16. In embodiments, the barrier layer 20 may be a nitride material that electrically and physically isolates the barrier gates 12 from the spin qubit gates 14 and the access gates 16. For example, the barrier layer 20 may act as sidewall spacers between the barrier gates 12, the spin qubit gates 14 and the access gates 16. Moreover, the barrier layer 20 may isolate the access gate 16 from the source and drain regions 22. The barrier layer 20 may also be used as an etch stop liner.

In embodiments, the source and drain regions 22 may be raised regions formed by an epitaxial growth process with an in-situ doping process as is known in the art such that no further explanation is required for a complete understanding of the present disclosure. An annealing process may be performed to drive in the dopant into the semiconductor material. A silicide contact 24 may be formed over the source and drain regions 22. It should be understood by those of skill in the art that silicide contacts will not be required on the metal gate structures; however, such silicide contacts are contemplated herein for polysilicon gate structures as further described with respect to FIG. 2.

In embodiments, the plurality of spin qubit gates 14 may comprise a gate dielectric material 14*a*, a gate metal material 14*b* and a cap material 14*c* on the gate metal material 14*b*. Similarly, the access gates 16 may comprise a gate dielectric material 16*a*, a gate metal material 16*b* and a cap material 16*c* on the gate metal material 16*b*. The gate dielectric material 14*a*, 16*a* may be a low-k dielectric material (e.g., SiON) or a high-k dielectric material. For example, the high-k dielectric material can be, e.g., HfO2 Al2O3, Ta2O3, TiO2, La2O3, SrTiO3, LaAlO3, ZrO2, Y2O3, Gd2O3, and combinations including multilayers thereof. The gate metal material 14*b*, 16*b* may be a workfunction material such as, e.g., Ti, TiAl, Al, TaN, TaAlC, TIN, TIC, Co, TaC, or other known workfunction metals. The workfunction materials and the dielectric material may be the same materials and fabricated in the same processes for both the access gates 16 and the spin qubit gates 14.

The workfunction materials and gate dielectric materials may be formed by chemical vapor deposition (CVD), physical vapor deposition (PVD) including sputtering, atomic layer deposition (ALD) or other suitable method. The cap material 14*c*, 16*c* may be an oxide material; although other capping materials may be contemplated herein. It should be recognized by those of skill in the art that the plurality of barrier gates 12 will not contact the spin qubit gates 14 and, more specifically, will be electrically isolated from at least the gate dielectric material 14*a*.

In alternative embodiments, for example, the spin qubit gates 14 comprise polysilicon material. Also, in this embodiment, the spin qubit gates 14 may also include a silicide contact (as can be represented by reference numeral 14*c*). It should be understood, though, that the silicidation (e.g., silicide contacts) can be optional as there are no large currents flowing through the qubits gate structures.

In operation, single electrons are "injected" into the spin qubit gates 14 by the access gates 16. The electrons will be confined underneath the spin qubit gate 14 using the potential generated by the barrier gates 12, e.g., quantum dot. In a high magnetic field, the electrons exhibit a spin. The entanglement of adjacent electrons is controlled by the potential generated by the barrier gates 12, e.g., qubit. With the structure described herein, it is now possible to minimize the qubit gate area to enable a single electron underneath one gate, i.e. smallest active area (RX) and shortest gate length. Moreover, with the structure described herein, it is also possible to minimize the gate pitch to optimize entanglement between adjacent qubits.

An optional barrier layer 28 may be formed over the structures 12, 14, 16. An interlevel dielectric material 30 may be formed over the optional barrier layer 28. In embodiments, the optional barrier layer 28 may be part of the interlevel dielectric material 30. By way of example, the interlevel dielectric material 30 may an oxide or nitride material, or may be alternating layers of an oxide and nitride material. A transistor 32 may be integrated into the structure using conventional CMOS technologies. For example, the transistor 32 may be a high-k metal gate formed on the semiconductor on insulator substrate 18*c*.

Contacts 34 may be formed to the gate structures 12, 14, 16 and 32, in addition to the source and drain regions 22. In embodiments, the contacts 34 may be staggered to ensure proper electrical isolation from one another. The contacts 34 allow each of the gate structures 12, 14, 16, 32 to be separately biased. The contacts 34 may be formed by conventional CMOS processes as described in more detail herein.

Figure 2:
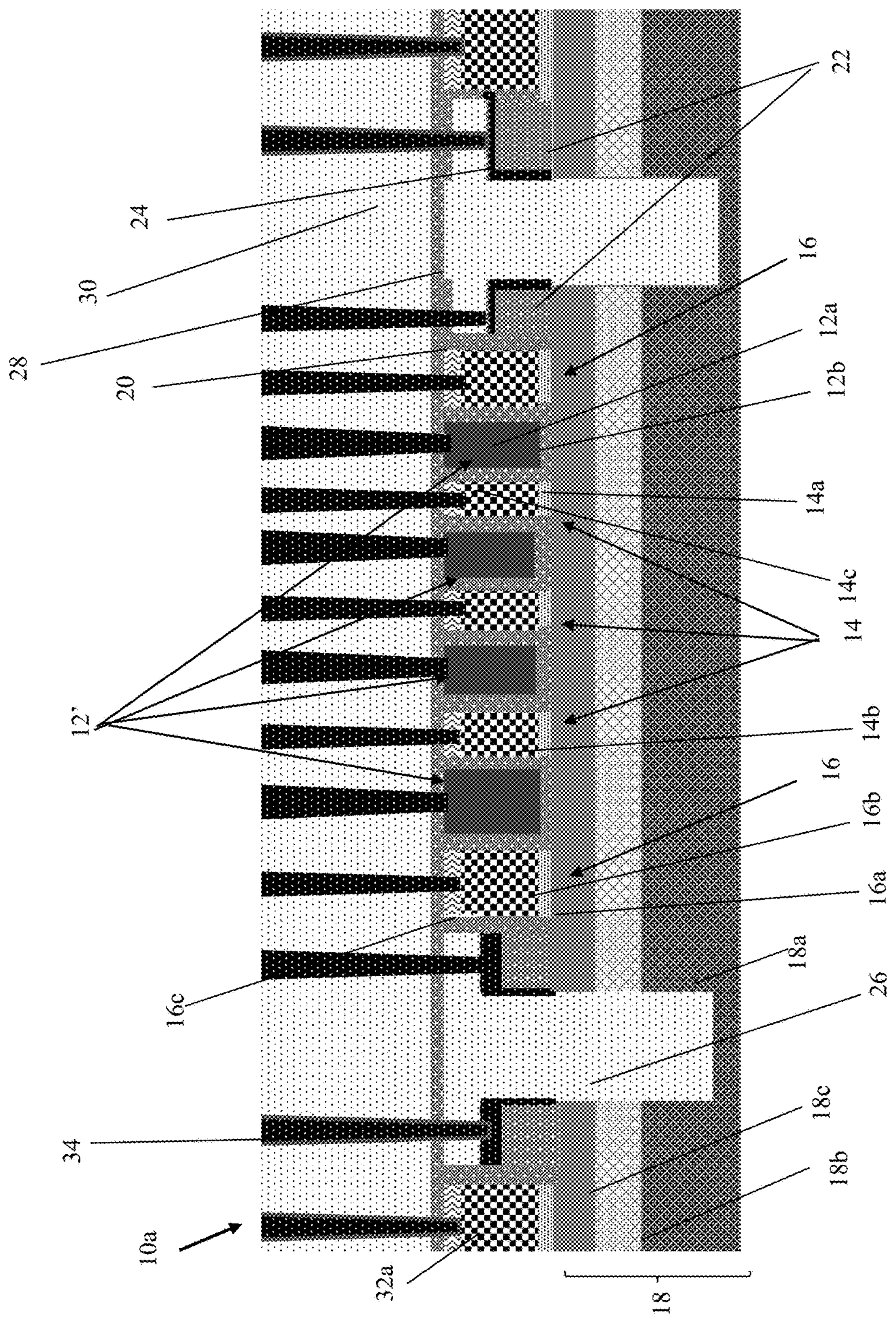
FIG. 2 shows a structure in accordance with additional aspects of the present disclosure.

FIG. 2 shows a structure in accordance with additional aspects of the present disclosure. Similar to the structure 10 of FIG. 1, the structure 10a of FIG. 2 includes a plurality of barrier gates 12' alternating with a plurality of spin qubit gates 14. In this embodiment, though, the plurality of barrier gates 12' comprise polysilicon material. In embodiments, the use of polysilicon may result in a tighter pitch of the self-aligned barrier gates 12'. Also, the barrier gates 12' may include a silicide contact (as can be represented by reference numeral 12c). The remaining structures are similar to the structure 10 of FIG. 1.

FIGS. 3A-3G show respective fabrication processes in accordance with aspects of the present disclosure. In embodiments, FIGS. 3A-3G show the general fabrication process scheme for the structure 10a of FIG. 2 with a back polish of the barrier gates. Generally, these figures show patterning of the spin qubit gates (e.g., FIG. 3A), a fill process comprising interlevel dielectric material followed by a polish back process (e.g., FIG. 3D), openings formed in the interlevel dielectric material (e.g., FIG. 3E), followed by formation of the barrier gates and a polish back process (e.g., planarized) (e.g., FIG. 3F). A silicidation of the source/drain access gates and spin qubit gates with cap material is also provided on the barrier gates at the same time (e.g., FIG. 3G). In this process flow, contacts land on the silicidation contacts (e.g., NiSi) for the source/drain access gates, spin qubit gates and the barrier gates.

Figure 3A:
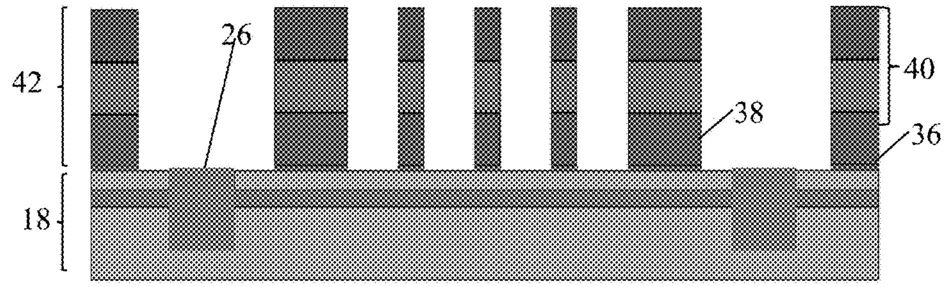
FIGS. 3A-3G show respective fabrication processes in accordance with aspects of the present disclosure.

More specifically, FIG. 3A shows the semiconductor substrate 18 with the shallow trench isolation structures 26 and a plurality of materials formed over the semiconductor substrate 18. The shallow trench isolation structures 26 may be formed by conventional CMOS processes. For example, a resist formed over the semiconductor substrate 18 is exposed to energy (light) and developed utilizing a conventional resist developer to form a pattern (opening). An etching process with a selective chemistry, e.g., reactive ion etching (RIE), will be used to transfer the pattern from the photoresist layer to the semiconductor substrate 18 to form one or more trenches in the semiconductor substrate 18 through the openings of the resist. Following the resist removal by a conventional oxygen ashing process or other known stripants, the insulator material (e.g., $SiO_2$) can be deposited by any conventional deposition processes, e.g., chemical vapor deposition (CVD) processes. Any residual material on the surface of the semiconductor substrate 18 can be removed by conventional chemical mechanical polishing (CMP) processes.

The plurality of materials may include, for example, a gate oxide material 36 (e.g., gate dielectric materials 14a, 16a), a gate metal 38 (e.g., gate metal materials 14b, 16b) and sacrificial mask material (e.g., hardmask) 40. The different materials may be deposited by conventional deposition processes, e.g., CVD, PECVD, etc., followed by an etching process to form stacks of the material (e.g., stacks 42). In embodiments, the stacks 42 will be used to form the plurality of spin qubit gates 14 and the access gates 16. The etching process can be a conventional reactive ion etching (RIE) process with selective chemistries.

Figure 3B:
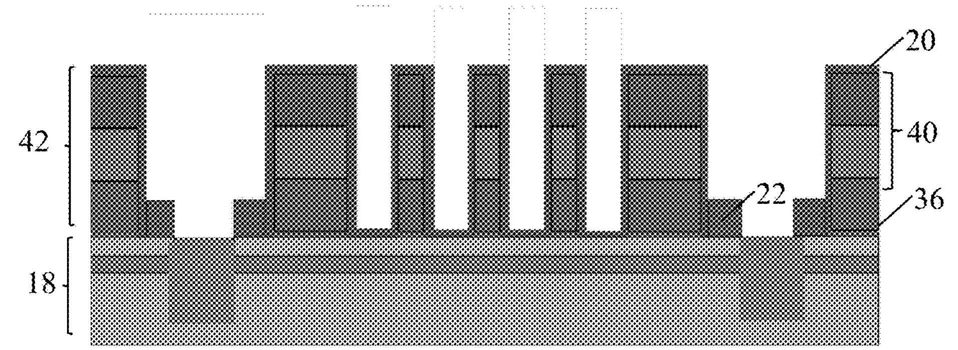

In FIG. 3B, a barrier liner (e.g., etch stop layer) 20 may be formed over the stacks 42 and exposed portions of the semiconductor substrate 18. In embodiments, the barrier layer 20 may be deposited by a conventional blanket deposition process. For example, the barrier layer 20 may be a nitride material formed by a CVD process.

The barrier layer 20 may be removed in the source and drain regions 22 using a conventional lithography and etching process. In embodiments, the hardmask for the lithography process will cover (e.g., protect) the stacks 42 (e.g., at locations of gate formation (e.g., gates 12, 14, 16) during the etching processes. In this way, the barrier layer 20 can be removed to expose the underlying semiconductor substrate 18 and the shallow trench isolation structures 26. Following a conventional strip and cleaning process, the raised source and drain regions 22 will be epitaxial grown on the exposed underlying semiconductor substrate 18 as already described herein.

Figure 3C:
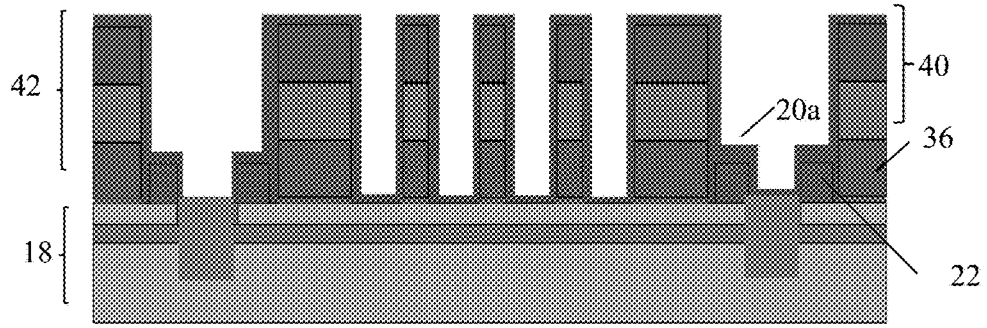

In FIG. 3C, an optional nitride liner 20a may be deposited on exposed surfaces of the stacks 42, source and drain regions 22 and shallow trench isolation structures 26. The optional nitride liner 20a may be formed by a conventional CVD process.

Figure 3D:
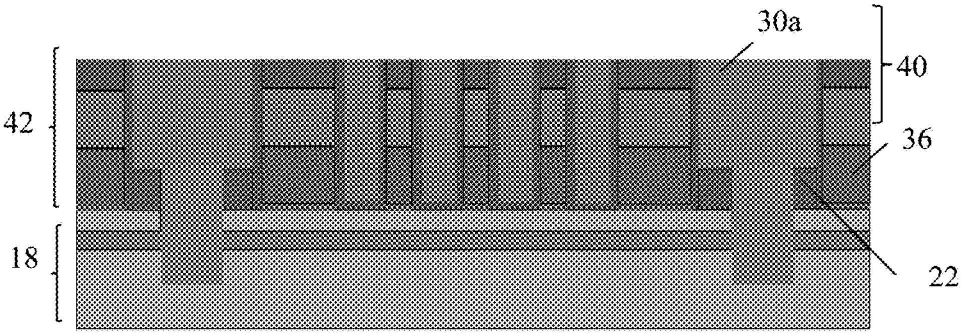

In FIG. 3D, an oxide fill 30a may be deposited between the stacks 42, and over the source and drain regions 22 and shallow trench isolation structures 26. The oxide fill 30a may undergo a chemical mechanical planarization (CMP) process. The CMP process will also planarize, e.g., remove, a portion of the sacrificial masks 40 of the stacks 42.

Figure 3E:
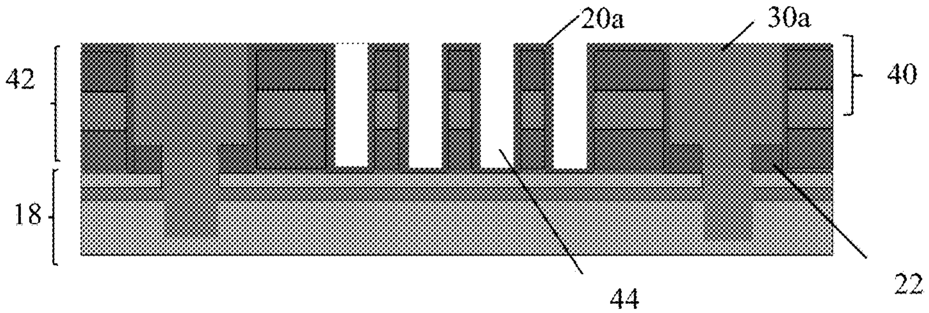

In FIG. 3E, openings 44 are formed in regions between selected stacks 42 by removing oxide fill 30a. More specifically, the oxide fill 30a may be removed at locations where the barrier gates will be formed thus forming, e.g., the openings 44. The oxide fill 30a can be removed by a conventional lithography and etching process. The etching process will stop of the barrier liner 20, e.g., etch stop layer.

Figure 3F:
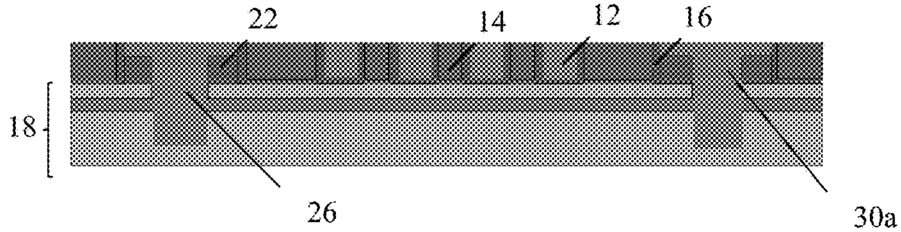

In FIG. 3F, a polysilicon gate structures 12 are formed in the openings 44, followed by planarization process. The structure is planarized to remove the remaining portion of the sacrificial masks 40 and an upper portion of the oxide fill 30a and polysilicon material. In this way, the gates 12, 14, 16 are now formed.

Figure 3G:
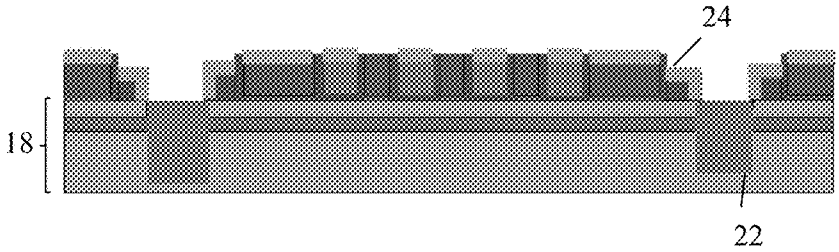

In FIG. 3G, the silicide contacts 24 may be formed on source and drain regions 22 barrier gates 12 and, in this embodiment, on the for spin qubit gates comprising polysilicon material. As should be understood by those of skill in the art, the silicide process begins with deposition of a thin transition metal layer, e.g., nickel, cobalt or titanium, over fully formed and patterned semiconductor devices (e.g., source and drain regions 22). After deposition of the material, the structure is heated allowing the transition metal to react with exposed silicon (or other semiconductor material as described herein) in the active regions of the semiconductor device (e.g., source and drain regions) forming a low-resistance transition metal silicide. Following the reaction, any remaining transition metal is removed by chemical etching, leaving silicide contacts in the active regions of the device. It should be understood by those of skill in the art that silicide contacts will not be required on the metal gate structures; however, such silicide contacts are contemplated herein for polysilicon gate structures as further described with respect to FIG. 2.

Referring back to FIG. 2, the contacts 34 may be formed to each of the gates 12, 14, 16 and source and drain regions 22. The contacts 34 may be formed by conventional lithography, etching and deposition methods known to those of skill in the art. The lithography and etching processes, for example, form vias or trenches through the interlevel dielectric material 30 exposing the underlying structures, e.g., gate structures 12, 14, 16, and source and drain regions 22. Metal material may be deposited within the trenches to contact the underlying structures. The metal material may be aluminum, copper, tungsten, etc., lined with a material such as TaN or Tin as examples. Any residual material may be removed from the interlevel dielectric material 30 by a conventional CMP process.

FIGS. 4A-4D show respective fabrication processes in accordance with additional aspects of the present disclosure. In embodiments, FIGS. 4A-4D show the general fabrication process scheme for the structure 10 of FIG. 1. In this process scheme, for example, the silicidation process may be performed prior to a barrier gate fill process. Also, in this process flow, the contacts land on metal barrier gates and on the silicidation (e.g., NiSi) contacts on the spin qubit gates and access gates. Also, the silicidation process is performed prior to the barrier gate fill process.

Figure 4A:
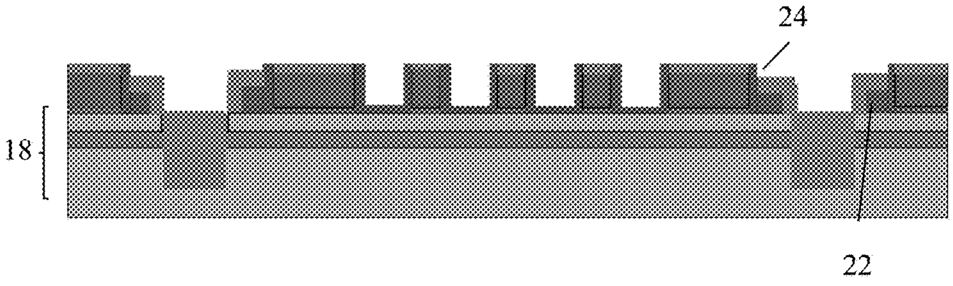
FIGS. 4A-4D show respective fabrication processes in accordance with additional aspects of the present disclosure.

Starting from the structure shown in FIG. 3B and referring to FIG. 4A, the hard mask materials 40 may be removed by a wet etching process. Subsequent to removal of the hardmask materials, a silicide contact 24 may be formed on the source and drain regions 22 as already described herein. The cap material or additional silicide contacts 15, as appropriate, may be formed over the remaining stack of materials which are used to form the spin qubit gates 14 and access gates 16, respectively.

Figure 4B:
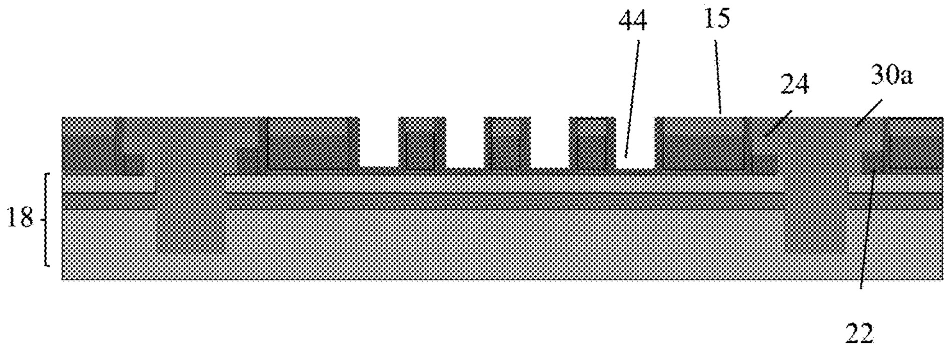

In FIG. 4B, the oxide fill **30*a* is formed over the source and drain regions 22. In embodiments, the oxide fill 30*a* may be deposited by a conventional CVD process, followed by a CMP process. The CMP process will stop of the on the silicide contacts or the cap material 15. The oxide fill 30*a* will be removed between the spin qubit gates 14 and between the spin qubit gates 14 and access gates 16, leaving the barrier layer 20 on the semiconductor substrate 18 within openings 44. The oxide fill 30*a*** may be removed by a conventional lithography and masking material.

Figure 4C:
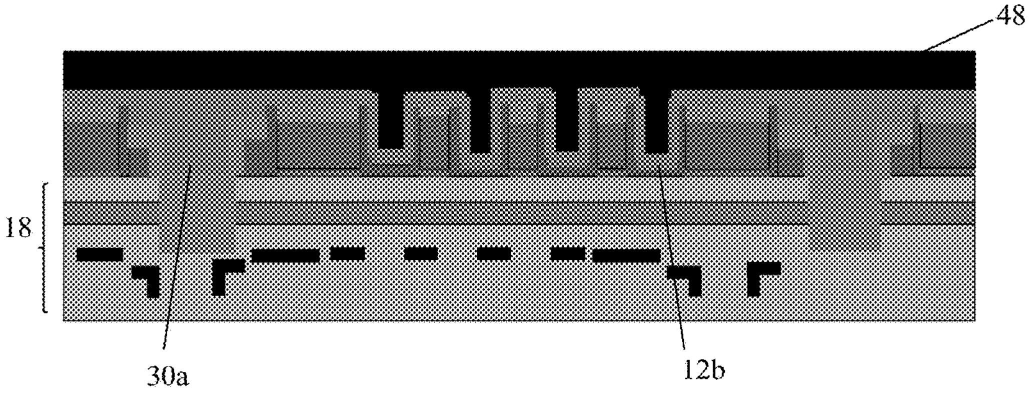
Figure 4D:
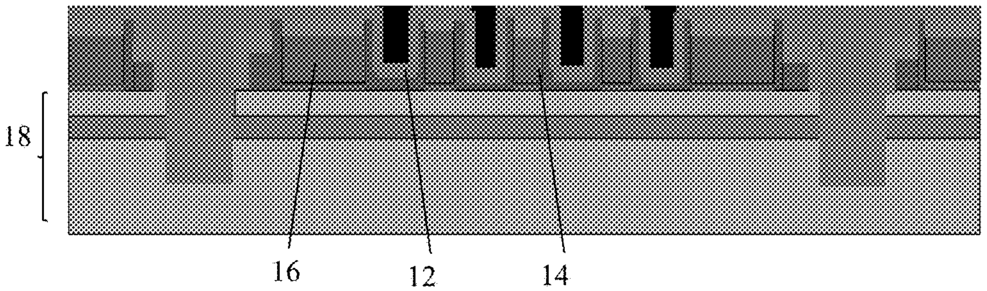

As shown in FIG. 4C, an insulator liner **12*b* and metal material 48 may be deposited within the openings 44 to form the barrier gates 12 between the between the spin qubit gates 14 and between the spin qubit gates 14 and access gates 16. In embodiments, the metal material 48 may be tungsten (W) and the insulator liner 12*b* may be an oxide, both of which can be deposited by conventional deposition processes, e.g., CVD. In FIG. 4D, the metal material 48 and the insulator liner 12*b* may undergo a planarization process, e.g., CMP, to form the barrier gates 12. The process can then revert back to FIG. 1, for example, to form the contacts 34**.

The structures can be utilized in system on chip (SoC) technology. The SoC is an integrated circuit (also known as a “chip”) that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a plurality of barrier gates, the plurality of barrier gates comprising conductive fill material surrounded by dielectric material;

a plurality of spin qubit gates configured to define quantum dots in a semiconductor substrate interdigitated with the plurality of barrier gates; and access gates positioned on opposing sides of the plurality of barrier gates and adjacent to source and drain regions, the access gates configured to electrostatically control carrier access to the quantum dots defined by the plurality of spin qubit gates, wherein the plurality of barrier gates are positioned between adjacent spin qubit gates and configured to control tunneling between adjacent quantum dots.

2. The structure of claim 1, wherein the plurality of barrier gates are barrier gates physically isolated from the plurality of spin qubit gates.

3. The structure of claim 1, wherein the plurality of barrier gates, the plurality of spin qubit gates and the access gates are contacted to be independently biased.

4. The structure of claim 1, wherein the plurality of barrier gates comprise metal material surrounded by insulator material, which isolates the plurality of barrier gates from the plurality of spin qubit gates.

5. The structure of claim 1, wherein the plurality of barrier gates comprise polysilicon material surrounded by insulator material, which isolates the plurality of barrier gates from the plurality of spin qubit gates.

6. The structure of claim 1, further comprising a liner material provided between the plurality of barrier gates and the plurality of spin qubit gates and access gates.

7. The structure of claim 1, wherein the access gates are larger than the plurality of barrier gates and the plurality of spin qubit gates.

8. The structure of claim 1, further comprising source and drain regions adjacent to the access gates.

9. The structure of claim 1, wherein the barrier gates are symmetrically positioned with respect to the plurality of spin qubit gates and the access gates.

10. The structure of claim 1, wherein the plurality of spin qubit gates comprise polysilicon.

11. The structure of claim 1, wherein the plurality of spin qubit gates comprise metal gate structures formed over high-k dielectric material.

12. The structure of claim 1, wherein the plurality of spin qubit gates, the access gates and the plurality of barrier gates are provided on a semiconductor-on-insulator (SOI) substrate.

13. A structure comprises:

spin qubit gates configured to define quantum dots in a semiconductor substrate;

barrier gates interdigitated with the plurality of spin qubit gates positioned between adjacent spin qubit gates and configured to control tunneling between adjacent quantum dots, the barrier gates comprising conductive fill material surrounded by dielectric material;

access gates positioned on opposing sides of the barrier gates and configured to control carrier transport between raised source and drain regions and the quantum dots;

raised source and drain regions adjacent to the access gates; and a liner material electrically isolating the spin qubit gates, the barrier gates and the access gates from one another, and electrically isolating the access gates from the raised source and drain regions.

14. The structure of claim 13, wherein the barrier gates are symmetric about the plurality of qubit gates.

15. The structure of claim 13, wherein the spin qubit gates comprise polysilicon with a silicide on top of the spin qubit gates.

16. The structure of claim 13, wherein the spin qubit gates comprise metal gate structures formed over high-k dielectric material.

17. The structure of claim 13, wherein the self-aligned barrier gates comprise metal material surrounded by insulator material.

18. The structure of claim 13, wherein the self-aligned barrier gates comprise polysilicon material surrounded by insulator material.

19. The structure of claim 13, wherein the self-aligned barrier gates and the spin qubit gates are contacted to be independently biased.

20. A method comprising:

forming a plurality of barrier gates, wherein the plurality of barrier gates comprise conductive fill material surrounded by dielectric material forming a plurality of spin qubit gates-configured to define quantum dots in a semiconductor substrate interdigitated with the plurality of barrier gates; and forming access gates on opposing sides of the plurality of barrier gates and adjacent to source and drain regions, the access gates configured to electrostatically control carrier access to the quantum dots, wherein the plurality of barrier gates are between adjacent spin qubit gates to control tunneling between adjacent quantum dots.

* * * * *